(12) United States Patent
Ma

(10) Patent No.: US 7,074,068 B1
(45) Date of Patent: Jul. 11, 2006

(54) ELECTRICAL CONNECTOR

(75) Inventor: Hao-Yun Ma, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/092,169

(22) Filed: Mar. 28, 2005

(30) Foreign Application Priority Data

Mar. 26, 2004 (TW) .............................. 93108284 A

(51) Int. Cl.
*H01R 13/62* (2006.01)
(52) U.S. Cl. ..................................................... 439/331
(58) Field of Classification Search ................ 439/331, 439/73, 342, 330
See application file for complete search history.

(56) References Cited

U.S. PATENT DOCUMENTS 6,485,320 B1 * 11/2002 Ma ............................ 439/342
6,648,664 B1 * 11/2003 McHugh et al. ............ 439/331
6,685,494 B1 * 2/2004 McHugh et al. ............ 439/342
6,692,279 B1 * 2/2004 Ma ............................ 439/331
6,741,089 B1 * 5/2004 Conroy ....................... 324/755

* cited by examiner

Primary Examiner—Phuong Dinh
(74) Attorney, Agent, or Firm—Wei Te Chung

(57) ABSTRACT

A land grid array connector of an embodiment of the present invention includes an insulative housing, a stiffener harnessed on the housing, a load plate and a lever pivotally mounted to two ends of the stiffener. A pair of spaced securing portions extends from an end of the load plate, around which the load plate is pivotally mounted to the stiffener. The stiffener includes a support portion that corresponds to an end portion between the securing portions. The support portion extends upwardly and outwardly in a manner such that when the load plate is driven to an opened position, said end portion of the load plate is urged to be seated upon the support portion so as to limit the opening of the load plate with respect to the housing.

14 Claims, 6 Drawing Sheets

ELECTRICAL CONNECTOR

BACKGROUND OF THE INVENTION

1. Field of the Invention

The invention is related to a land grid array (LGA) connector. The LGA connector connecting an IC package with a printed circuit board includes an insulative housing, a plurality of contacts received in the housing, a stiffener enclosing the housing, a load plate pivotally connected with the stiffener and a load lever connected with the stiffener. The stiffener has a long support portion at a bottom side. The long support portion can resist on one side of the load plate and stop it when the load plate is in its open position.

2. Description of the Prior Art

Referring to FIG. 4 to FIG. 6, a conventional land grid array (LGA) connector is illustrated. The LGA connector 8 connecting an IC package with a printed circuit board comprises an insulative housing 82, a plurality of contacts 81 received in the housing 82, a metal stiffener 83 partly covering and reinforcing the housing 82, a metal load plate 84 pivotably mounted to an end of the stiffener 84, and a lever 86 pivotably mounted to an opposite end of the stiffener 84 for engaging with the load plate 84. A pair of spaced securing portions 87 of the load plate 84 is mounted pivotably with a pair of block opening 89 respectively. The load plate 84 defines an engaging portion 90 which comprises an inclining portion 902 and a pressed portion 904. The load plate defines a tail 88 opposite to the engaging portion 90 and between the pair of spaced securing portions 87. An IC package 100 was pressed by the load plate 84 of the connector 8 to connect electrically with the contact 81 received in the housing 82. The lever 86 includes an operating portion 85 which defines an offset actuating portion 850. The lever 86 presses the load plate 84 to the IC package 100, The IC package 100 electrically connects with the contacts 81.

When the IC package 100 is put on the housing 82, the load plate 84 is pivoted from a perpendicular position to a horizontal position. The spaced securing portion 87 of the load plate 84 is moved pivotally in the block opening 89 of the stiffener 83. The tail 88 of the load plate 84 can resist on the support portion 92 of the stiffener 83, thereby preventing the load plate 84 from breaking off from the stiffener 83. When the connector 8 is in the perpendicular position, the tail 88 may be prone to scrape the PCB, even destroy adjacent electrical trace on the PCB.

In view of the above, a new land grid array connector, which overcomes the above-mentioned disadvantage, is desired.

SUMMARY OF THE INVENTION

Accordingly, an object of the present invention is to provide a land grid array (LGA) connector without destroying the printed circuit board.

Other object of the present invention is provide an LGA connector of the present invention with ability to position the load plate in an open position securely.

To achieve the above-mentioned objects, a land grid array connector of the present invention comprises an insulating housing, a load plate and a stiffener. The insulating housing defines a number of terminal-passages for receiving a corresponding number of contacts. The load plate has a substantially plate configuration with a generally rectangular window in a middle thereof. The load plate defines a pair of spaced securing portions. The stiffener defines a pair of block openings corresponding to the pair of spaced securing portions. The stiffener defines four bottom sides connecting end to end. A wall extends upwardly from one of the bottom side. The wall defines a long support portion resisting on the load plate when the load plate is in its open position. The long support portion can prevent the load plate from breaking off from the stiffener and avoid the load plate to scrape the trace of the printed circuit board.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Figure 1:
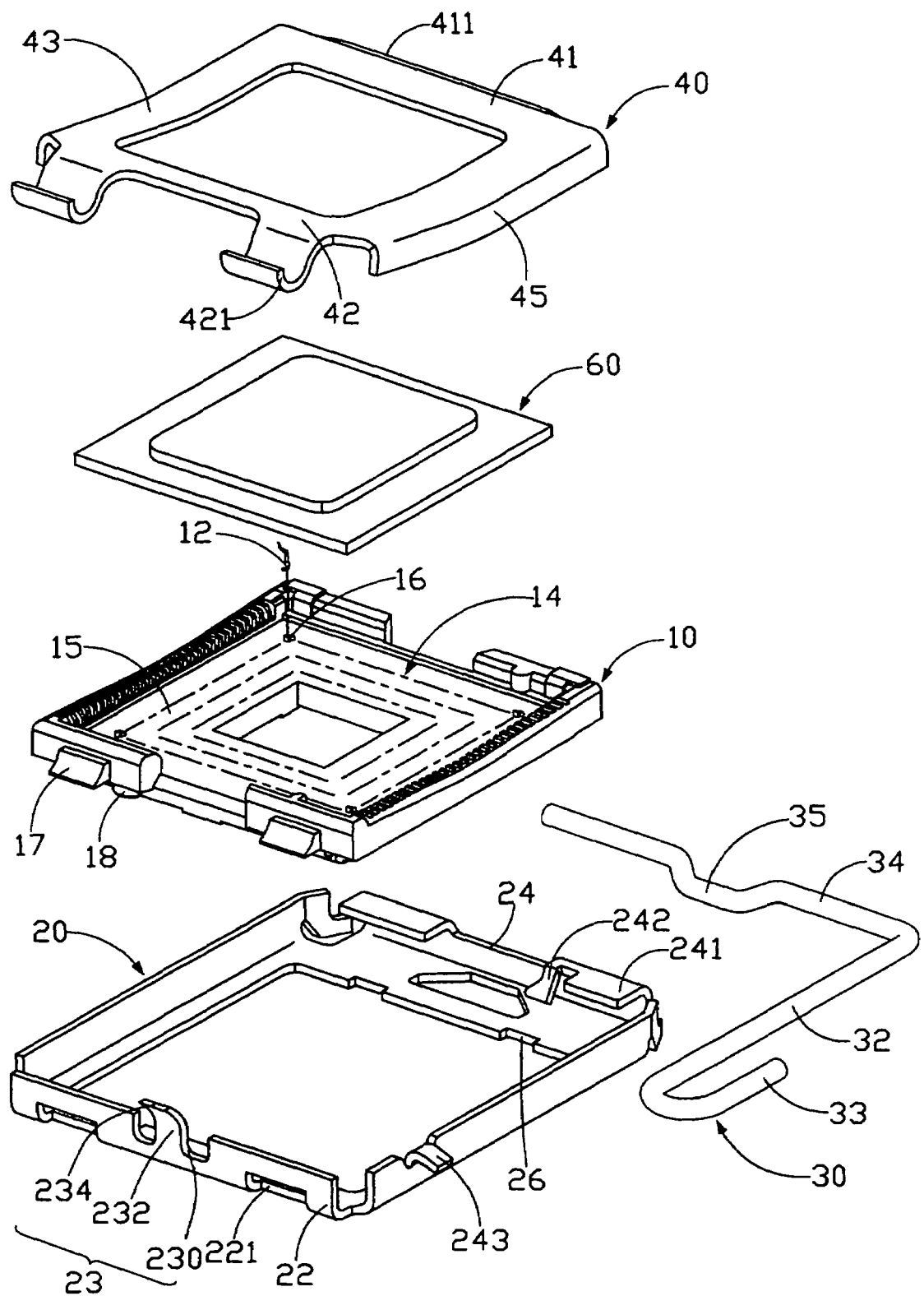
FIG. 1 is an exploded, isometric view of an LGA connector in accordance with a preferred embodiment of the present invention.
Figure 2:
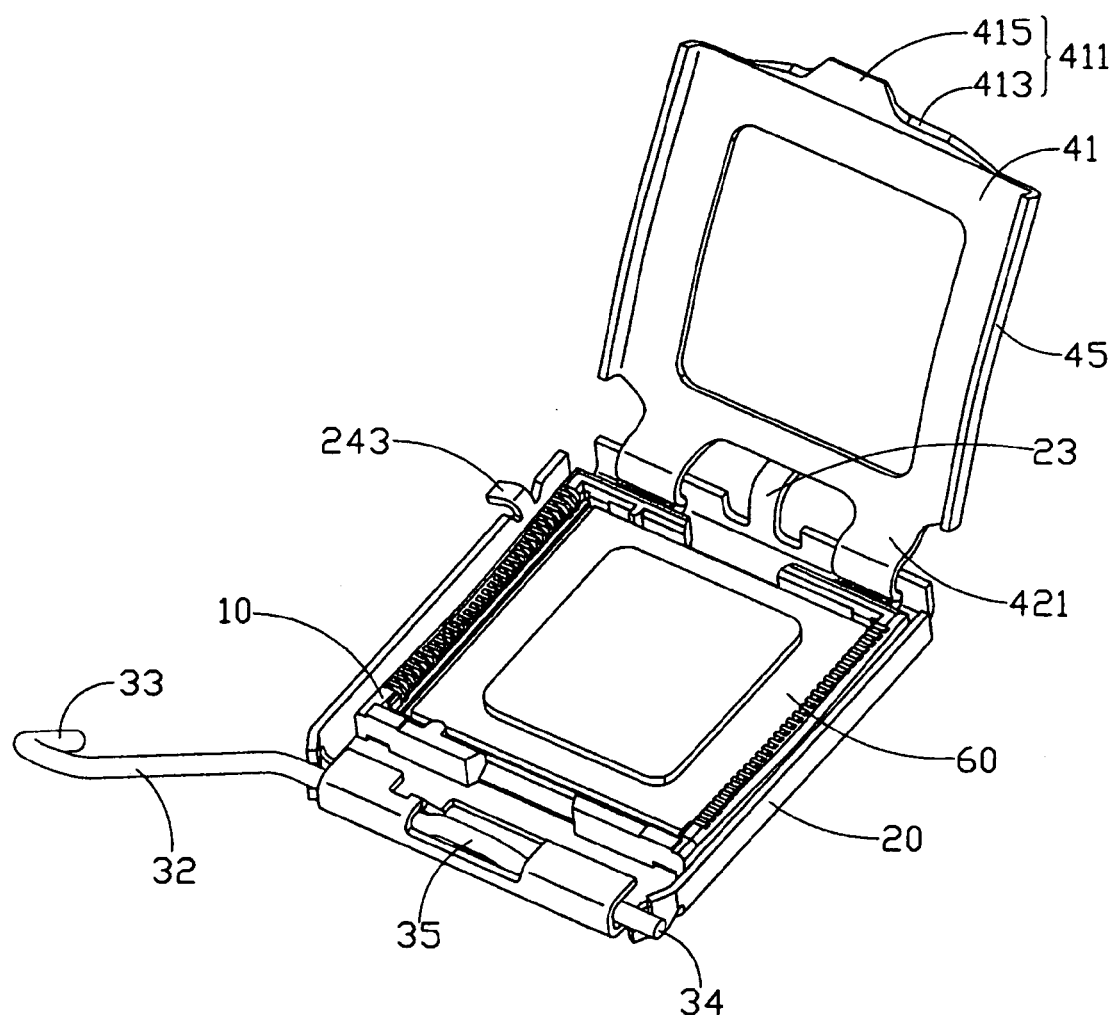
FIG. 2 is an assembled, isometric view of the present LGA connector when the connector is in an open position.
Figure 3:
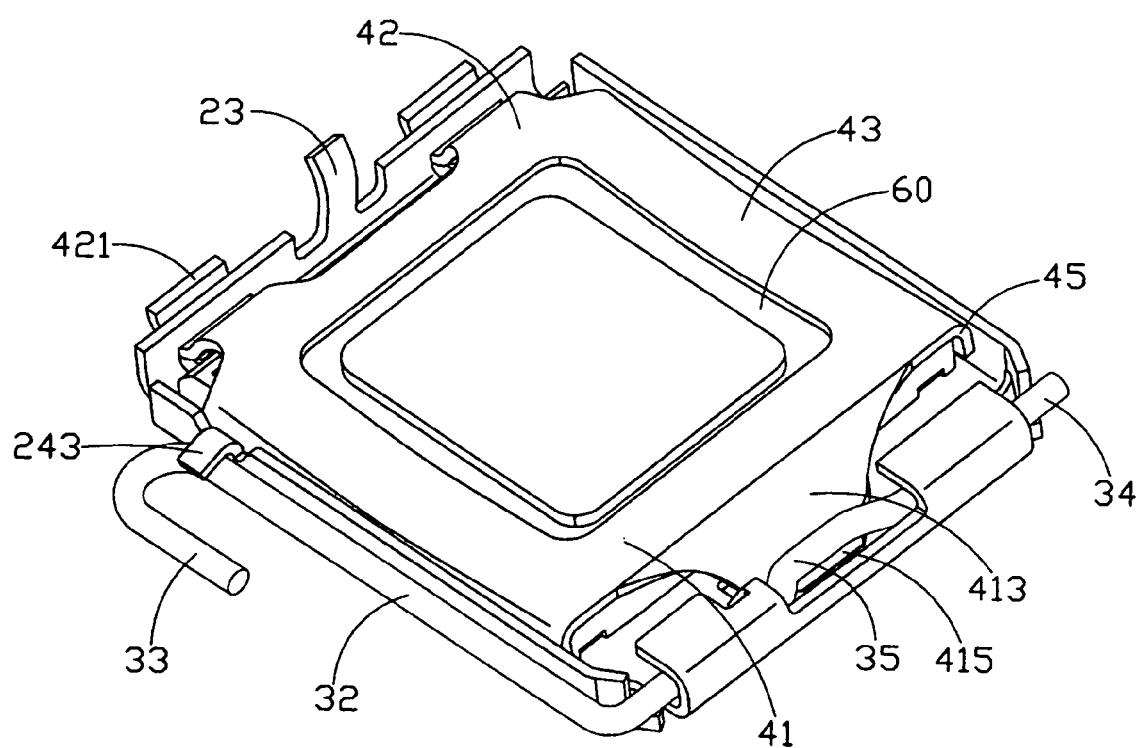
FIG. 3 is an assembled, isometric view of the present LGA connector when the connector is in a close position.
Figure 4:
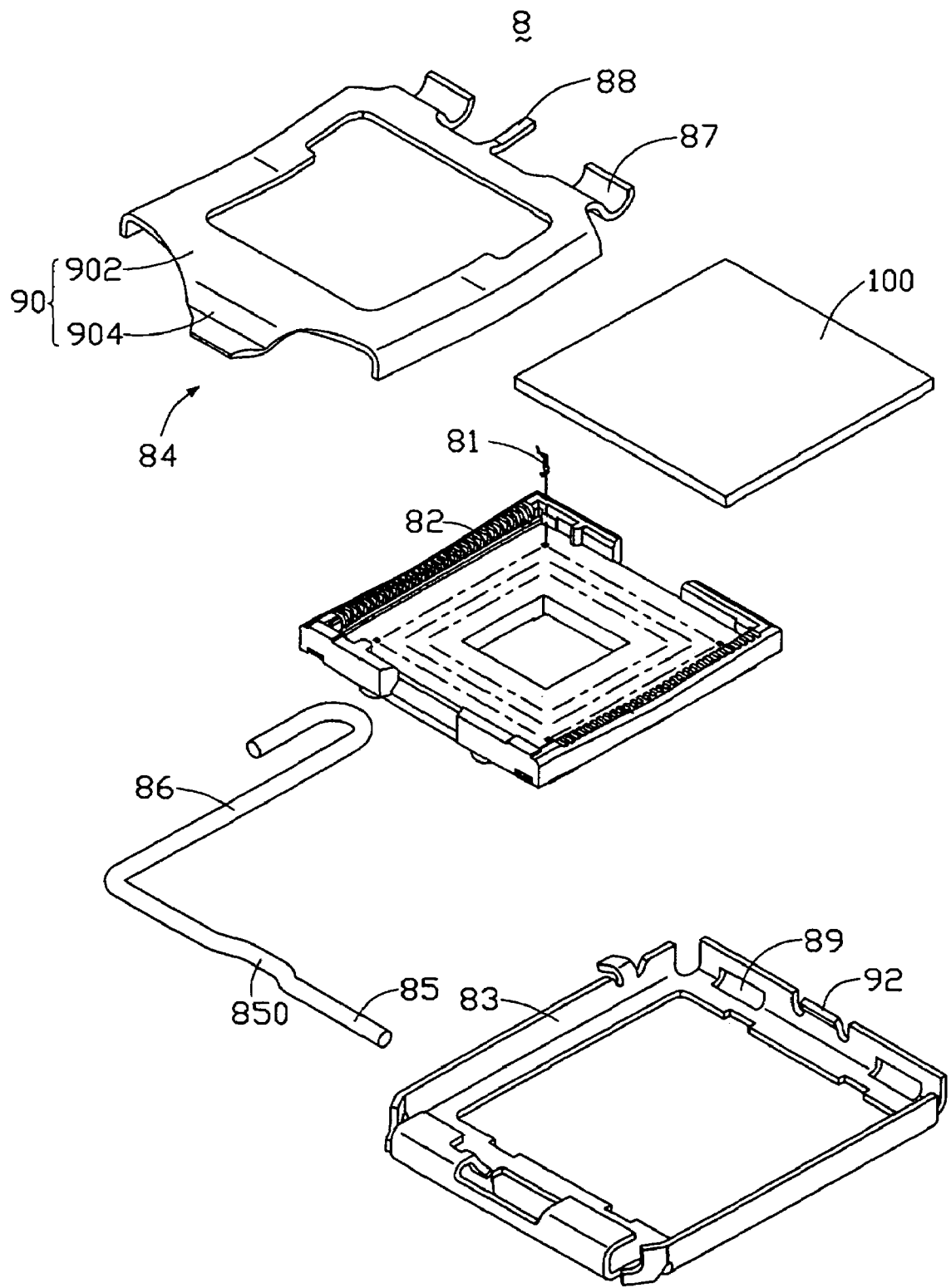
FIG. 4 is an exploded, isometric view of a conventional LGA connector.
Figure 5:
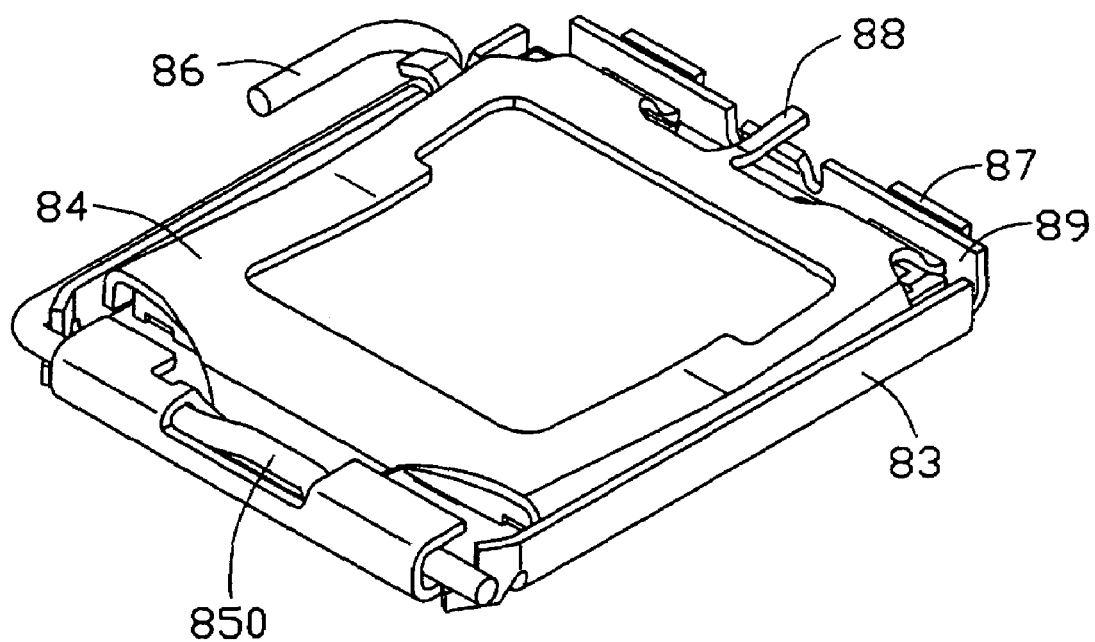
FIG. 5 is an assembled, isometric view of the conventional LGA connector when the connector is in a close position.
Figure 6:
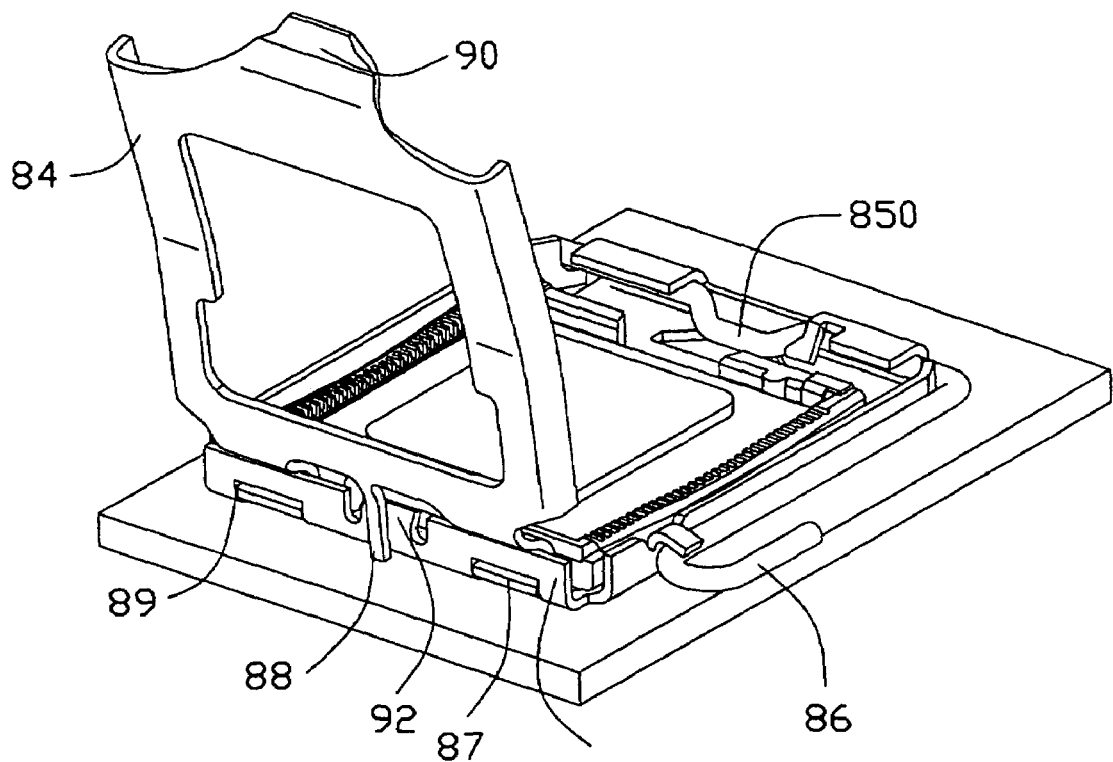
FIG. 6 is an assembled isometric view of the conventional LGA connector when the connector is in an open position.

Referring to FIG. 1 to FIG. 3, the connector connecting the IC package 60 with the printed circuit board (not shown) comprises a generally rectangular insulative housing 10, a multiplicity of contacts 12 received in the housing 10, a metal stiffener 20 partly covering and reinforcing the housing 2, a lever 30 pivotably attached to in and of the stiffener 20, a metal load plate 4 pivotably mounted to an opposite end of the stiffener 20 for engaging with the lever 30.

The housing 2 defines a generally rectangular electrical area 14 in a middle thereof, for receiving an IC package 60 such as an LGA central processing unit (CPU). The electrical area 14 defines a multiplicity of terminal-passages 16, the terminal-passages 16 receiving a corresponding number of the contacts 12 therein respectively. The electrical area 20 defines a touch plane 15 at a top thereof. Each contact 12 has a contacting portion (not shown) protruding outwardly from a top face of the electrical area 14, for resiliently electrically contacting a corresponding pad of the IC package 60. The housing 10 is formed with a plurality of position protruding 18 at a bottom side thereof. One sidewall of the housing defines a pair of loading portions 17.

The load lever 30 comprises an actuating portion 32 and a locating portion 34 which is generally perpendicular to the actuating portion 32, the other end of the actuating portion 30 defines a handing portion 33 outwardly. The locating portion 34 defines an offset actuating portion 35 at a middle thereof.

The load plate 4 is generally rectangular with a window in a middle thereof. The load plate 4 comprises a first side 41 with an engaging portion 411 extending from thereof and a second side 42 with a pair of spaced securing portions 421 extending from thereof. The other two sides of the load plate 4 defines a pressed portion 43 respectively. The pressed portion 43 protrudes to the side of the housing 2 in order to press the IC package 60. Then the pads of the IC package 60 contact electrically with the contacts 24. The pressed portion 43 extends a side wing at an exterior respectively which covering the housing 2 when the load plate is in its close position. The pressed portions 43 of the load plate press the IC package 60. The offset actuating portion 35 of the load lever 30 presses the engaging portion 411. The pressed portions 43 of the load plate press the IC package to make the pads of the IC package contact with the contacts.

The stiffener 20 comprises four bottom sides connecting end to end and four walls extending upwardly from the bottom sides, respectively around the housing 10. A first wall 22 is corresponding to the second side 42 of the load plate 4 and a second wall 24 is corresponding to the first side 41 of the load plate 40. The first wall 22 defines a pair of block openings 221 corresponding to the pair of spaced securing portions 421 of the load plate 4 respectively. The block openings 221 engage with the spaced securing portions 421 in order to mount the load plate 40 onto the stiffener 20. The second wall defines a pair of block portion 241, a securing portion 242 extends from one of the block portion 241. The lever 30 can be mounted on the second wall 24 with the block portion 241 and the securing portion 242 securing the lever 30. One wall between the first wall 22 and the second wall 24 defines a protruding piece 243 like a hook to secure the handing portion 33 of the lever 30. The two sides of the stiffener 20 opposite each other define a pair of grooves 26 corresponding to the positioning portions 18 of the housing 10 respectively. The first wall 22 defines a long support portion 23 on the middle thereof, and extending slantwise and upward to the load plate 40. The long support portion 23 comprises a connecting portion 230 which connects the first side 22, a main portion 232 and a resist portion 234 which resists on the first side 42 of the load plate 40.

The mounting process of the connector is: the load plate 40 and the load lever 30 is mounted pivotably on the first side 22 and the second side 24 of the stiffener 20, respectively. The housing 10 is put on the stiffener 20 after opening the load plate 40, the position protrudings 18 of the housing 10 are pressed into the grooves 26 of the stiffener, respectively.

When the load plate 40 pivots to away from the close position, the second side 42 of the load plate 40 resists on the long support portion 23 of the stiffener 20 to avoid the load plate 40 breaking off from the stiffener 40. The long support portion 23 can also keep the load plate 40 from over-rotating to destroy adjacent electrical traces on the printed circuit board. Then the IC package 60 is put into the electrical area 14 of the housing 10. The pads of the IC package 60 are corresponding to the contacts 12 received in the housing 10, respectively. The load plate 40 is pivoted to the close position. The spaced securing portions 421 of the load plate 40 blocks the block opening 221 of the stiffener and the actuating portion 32 of the load lever 30 pivots from perpendicular to horizontal position. The offset actuating portion 35 of the load lever 30 presses on the pressed portion 415 of the load plate 40. The load plate 40 presses the IC package 60 to make it contact with the contacts 12.

The second wall 42 of the load plate 40 corresponding to the long support portion 23 of the stiffener 20 can define a recess. The resist portion 234 of the long support portion 23 can resist in the recess when the load plate 40 pivots to away from the close position to avoid the load plate 40 over-rotating. The load plate 40 is restricted on the open position more stabilized. The long support portion 23 of the stiffener can also extend from the bottom side of the stiffener 20. The long support portion 23 can also be defined on other positions of the first wall 22. The first wall 22 can also define more than one long support portion 23 to support the load plate 40.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector for connecting an IC package and a printed circuit board, the electrical connector comprising:
    an insulative housing defining a plurality of terminal-passages;
    a plurality of contacts received in the terminal-passages respectively;
    a stiffener harnessed on the housing;
    a load plate and a lever pivotally mounted to two ends of the stiffener;
    a pair of spaced securing portions extending from an end of the load plate around which the load plate is pivotally mounted to the stiffener; wherein
    the stiffener includes a support portion that corresponds to an end portion between the pair of securing portions of the load plate, said support portion extends upwardly and outwardly in a manner such that when the load plate is driven to an opened position, said end portion of the load plate is urged to be seated upon the support portion so as to limit the opening of the load plate with respect to the housing.

2. An electrical connector comprising:
    an insulative housing;
    a plurality of conductive terminals disposed in the housing with upper contacting ends extending above an upper face of the housing;
    a stiffener harnessed on the housing; and
    a load plate and a lever respectively attached to around two opposite lengthwise ends of the stiffener, the load plate being pivotally moveable relative to the stiffener; wherein
    the stiffener includes an upward extending support portion at thereof the corresponding end around which the load plate is attached to, and said support portion is dimensioned long enough to abut against and stop the load plate so as to limit further movement of said load plate with respect to the housing when said load plate is upwardly and outwardly rotated to an outermost position for facilitating loading/unloading an IC package into/from the housing.

3. The connector as defined in claim 2, wherein said support portion is located outside of the stiffener.

4. The connector as defined in claim 2, wherein said load plate is directly pivotally mounted to the corresponding end of the stiffener.

5. The connector as defined in claim 2, wherein when said load plate is upwardly and outwardly rotated to an outermost position, there is no portion extending downwardly from said load plate or the stiffener for interference with a printed circuit board located below the connector.

6. The connector as defined in claim 2, wherein at least part of said support portion extends out of a periphery of the stiffener.

7. The connector as defined in claim 2, wherein said support portion is dimensioned such that an end portion of the load plate is urged to be seated upon and terminated on said support portion to limit the further movement of said load plate with respect to the housing.

8. The connector as defined in claim 7, wherein said support portion is dimensioned long enough to abut against an end edge of the load plate.

9. The connector as defined in claim 8, wherein the load plate defines a recess thereof corresponding to the support portion, a middle portion of the support portion resides within the recess while not contacting any portion of the load plate when the load plate is in a fully-opened position.

10. The connector as defined in claim 2, wherein the stiffener is made of metal.

11. The electrical connector as claimed in claim 1, wherein said support portion is configured to abut against and stop an end edge of the load plate so as to limit the opening of the load plate with respect to the housing.

12. The electrical connector as claimed in claim 1, wherein the load plate defines a recess thereof corresponding to the support portion, a middle portion of the support portion resides within the recess while not contacting any portion of the load plate when the load plate is in a fully-opened position.

13. The electrical connector as claimed in claim 1, wherein when the opening of the load plate is limited by the support portion, there is no portion extending downwardly from the load plate or the stiffener for interference with a printed circuit board located below the electrical connector.

14. The electrical connector as claimed in claim 1, wherein the stiffener is made of metal.

* * * * *